US006457094B2

(12) United States Patent
Zheng (10) Patent No.: US 6,457,094 B2
(45) Date of Patent: *Sep. 24, 2002

(54) MEMORY ARRAY ARCHITECTURE SUPPORTING BLOCK WRITE OPERATION

(75) Inventor: Hua Zheng, Fremont, CA (US)

(73) Assignee: Winbond Electronics Corporation, Hsin Chi (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/235,222

(22) Filed: Jan. 22, 1999

(51) Int. Cl.$^7$ ................................................ G06F 12/00
(52) U.S. Cl. ........................... 711/105; 711/5; 711/108
(58) Field of Search ........................... 711/5, 105, 108; 365/230.01, 230.02, 230.03

(56) References Cited

U.S. PATENT DOCUMENTS

| | | | |
|---|---|---|---|
| 4,733,376 A | | 3/1988 | Ogawa ........................ 365/221 |
| 5,617,555 A | * | 4/1997 | Patel et al. ................... 711/105 |
| 5,621,695 A | * | 4/1997 | Tran ........................ 365/230.03 |
| 5,896,339 A | * | 4/1999 | McLaury ................ 365/230.02 |
| 5,930,194 A | | 7/1999 | Yamagata et al. ........... 365/230 |
| 5,933,386 A | * | 8/1999 | Walker et al. ......... 365/230.01 |
| 5,940,329 A | | 8/1999 | Seitsinger et al. ........... 365/189 |
| 5,949,697 A | | 9/1999 | Lee ................................ 365/51 |
| 5,959,918 A | | 9/1999 | Arimoto ...................... 365/205 |
| 5,995,404 A | | 11/1999 | Nakamura et al. ............ 365/63 |
| 6,047,352 A | * | 4/2000 | Lakhani et al. ................. 711/5 |
| 6,070,222 A | * | 5/2000 | Farmwald et al. ........... 711/105 |
| 6,078,987 A | * | 6/2000 | Kongetira .................... 711/108 |
| 6,094,396 A | * | 7/2000 | Zheng ..................... 365/230.03 |

FOREIGN PATENT DOCUMENTS

EP  0810607 A2  *  3/1997  ............ G11C/7/00

* cited by examiner

Primary Examiner—David Hudspeth
Assistant Examiner—Fred F. Tzeng
(74) Attorney, Agent, or Firm—Dinh & Associates (57) ABSTRACT

A memory array architecture that supports block write operation and has many advantages over conventional memory array architectures. A memory array is partitioned into a number of (N) segments. Each segment includes at least one bit line. Each segment is associated with a local input/output (I/O) line that couples to zero or more bit lines within that segment. The bit lines are coupled to the local I/O line by controlling one or more column select lines associated with that segment. Each segment is also associated with a write driver that couples to the local I/O line. Each local I/O line has a length that is a portion of a length of the memory array. A block write operation is performed by concurrently driving one or more write drivers (up to N write drivers). Each write driver drives the bit lines coupled to the local I/O line associated with that write driver.

21 Claims, 7 Drawing Sheets

MEMORY ARRAY ARCHITECTURE SUPPORTING BLOCK WRITE OPERATION

BACKGROUND OF THE INVENTION

The present invention relates generally to memory devices, and more particularly to a memory array architecture that supports block write operation.

Memory devices are integral to a computer system, and to many electronic circuits. Continuous improvements in the operating speed and computing power of a central processing unit (CPU) enables operation of an ever-greater variety of applications, many of which require faster and larger memories. Larger memories can be obtained by shrinking the geometry of the memory cells and data lines within memory devices. However, with regard to memory speed, the access time for a memory device is generally governed by certain limitations. More particularly, memory speed is, to a large extent, dictated by the charge and discharge rates of parasitic capacitance on internal data lines.

Conventionally, a memory access to write a data bit is performed by: (1) activating a row control line (or word line) for the required memory location; (2) receiving a write command and the data bit; (3) activating a column select line; and (4) providing the data bit to the memory cell. Conventionally, these steps are performed in sequential order for each accessed data bit. These steps also define the access time of a memory device (i.e., to write a data bit) which, in turn, determines the data transfer rate.

Incremental improvements in the data transfer rate for a memory write can be achieved by reducing the charge time of the internal data lines. The charge time can be improved by shrinking the geometry of the device, thus reducing the parasitic effects. Substantial improvement in the data transfer rate can be achieved by performing a concurrent write of a block of data bits to the memory device.

Several conventional memory array architectures support block write operation. One architecture uses a single write driver that concurrently drives a set of bit lines in the memory array. This design requires a large write driver having the capability to drive all connected bit lines. For example, to support an 8-bit block write operation the write driver is designed to concurrently drive eight bit lines. This design is also inflexible since it writes the same data bit to all connected bit lines.

A second architecture alleviates some of the problems associated with the first architecture by using multiple (e.g., two) write drivers. Each write driver drives a smaller number of bit lines and can be designed with lower drive capability. Multiple write drivers also allow multiple data bits to be concurrently written to the memory array. For example, a design with two write drivers can divide an 8-bit block write operation into two 4-bit block write operations performed by the two write drivers. The second design is an improvement over the first design but requires additional circuitry and internal data lines.

The additional circuitry and internal data lines, while necessary to support block writes of multiple data bits to multiple memory locations, result in a larger circuit die area and increased cost. The increased die area is essentially a "die penalty" for the ability to concurrently write a block of data bits to memory. As can be seen, a memory array architecture that supports block write operations with minimal die and cost penalties is highly desirable.

SUMMARY OF THE INVENTION

The invention provides a memory array architecture that supports block write operation and has many advantages over conventional memory array architectures while incurring a small "die penalty." The invention achieves this by partitioning a memory array into segments. With N segments, the memory array supports a block write of up to N data bits to memory with minimal performance degradation, if at all.

A specific embodiment of the invention provides a memory device that includes at least one memory array. Each memory array is partitioned into a number of segments. Each segment includes one or more bit lines. Each segment is further associated with a local input/output (I/O) line that couples to zero or more bit lines within that segment. The bit lines are coupled to the local I/O line by controlling one or more column select lines associated with that segment. Each segment is also associated with a write driver that couples to the local I/O line. Each local I/O line has a length that is a portion of the length of the memory array. A block write operation is performed by concurrently driving one or more write drivers (up to N write drivers). Each write driver drives the bit line(s) coupled to the local I/O line(s) associated with that write driver.

The local I/O lines associated with each memory array can be designed to have similar lengths. Further, the combined lengths of the local I/O lines associated with a memory array can be approximately equal to the length of the memory array. These characteristics reduce die area and can improve performance.

In an embodiment, each write driver drives a single bit line at any given moment. This embodiment provides similar performances for a block write and a "normal" write to a single bit line. In another embodiment, each write driver can be designed to concurrently drive multiple bit lines to allow for a larger sized block write than the number of available write drivers.

The invention also supports a double data rate (DDR) block write operation. The DDR block write allows a 2M block write to be achieved by writing to one group of M bit lines during a first clock phase (e.g., the rising edge) and to another group of M bit lines during a second clock phase (e.g., the falling edge). The block write operation can be initiated upon receiving masking information for the bit lines.

The foregoing, together with other aspects of this invention, will become more apparent when referring to the following specification, claims, and accompanying drawings.

DESCRIPTION OF THE SPECIFIC EMBODIMENTS

Figure 1:
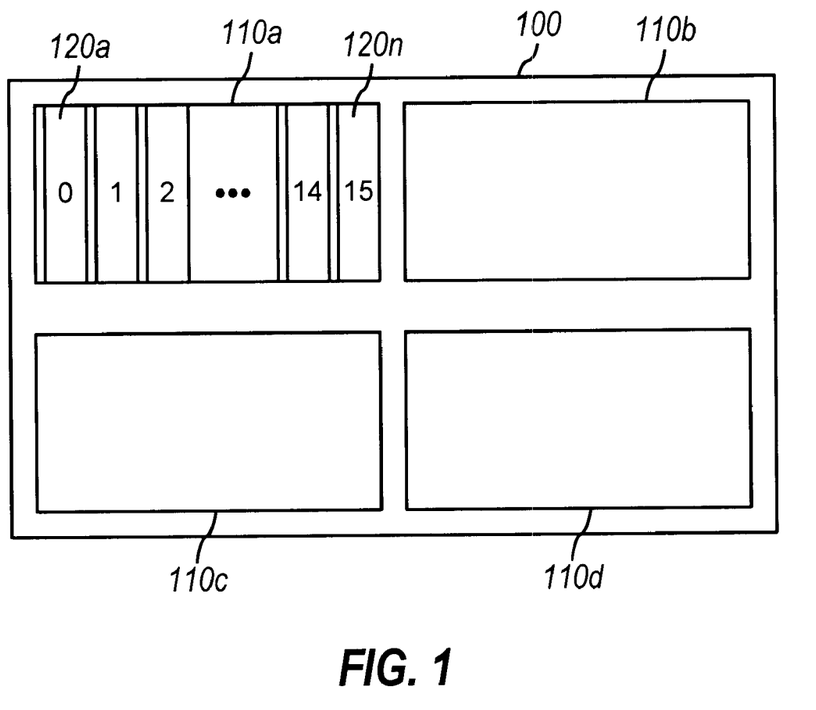
FIG. 1 shows a diagram of a specific embodiment of a memory device.

FIG. 1 shows a diagram of a specific embodiment of a memory device 100. As shown in FIG. 1, memory device 100 includes, for example, four memory array blocks 110a through 110d. Each memory array block 110 includes, for example, sixteen memory arrays 120a through 120n. Generally, a memory device can include greater or fewer number of memory array blocks, and each memory array block can include greater or fewer number of memory arrays than that shown in FIG. 1. As an example, memory device 100 can be a 64-Mbit DRAM device having four memory array blocks 110, with each memory array block 110 including sixteen memory arrays 120, whereby each memory array block 110 includes 16 million bits (Mbits) of memory and each memory array 120 includes 1 Mbits of memory. As another example, memory device 100 can be a 256-Mbit DRAM device having eight memory array blocks 110, with each memory array block 110 including sixteen memory arrays 120, whereby each memory array block 110 includes 32 Mbits of memory and each memory array 120 includes 2 Mbits of memory.

Memory array 120 includes memory cells for many data bits. The memory cells are typically arranged in a two-dimensional array. A word line signal (WL) selects a particular row within memory array 120, and a column select line (CSL) selects a particular column. Typically, one CSL is provided for one or more bit lines (BL). The word line and CSL are activated in accordance with a memory address provided by a source external or internal to memory device 100.

Figure 2:
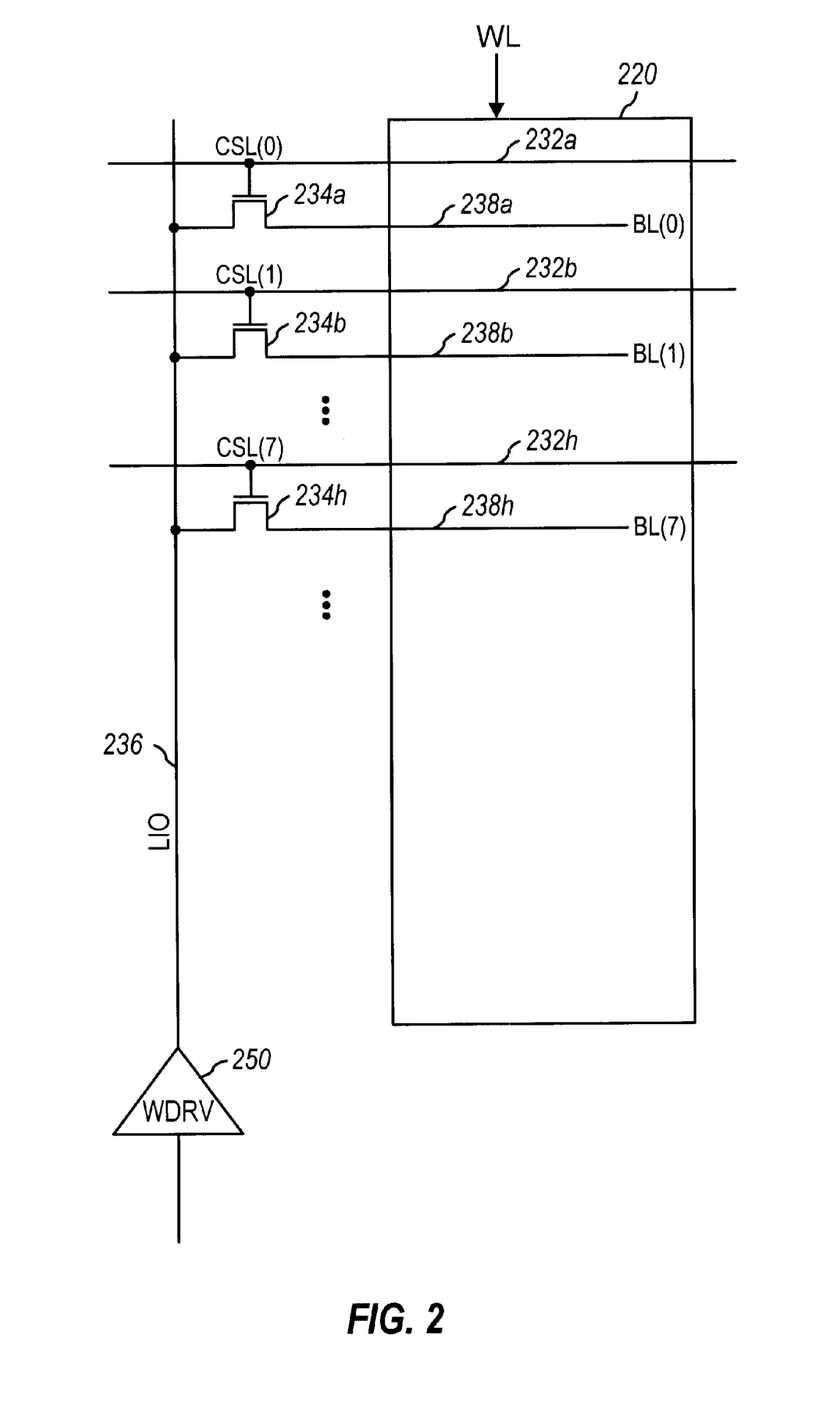
FIG. 2 shows a schematic diagram of a conventional memory array architecture that supports block write operation.

FIG. 2 shows a schematic diagram of a conventional memory array architecture that supports block write operation. As shown in FIG. 2, a number of CSLs 232 traverses through a memory array 220. Each CSL 232 couples to the gate of an N-channel transistor 234. The source of transistor 234 couples to a local I/O line (LIO) 236 and the drain of transistor 234 couples to a bit line (BL) 238. Each CSL 232 controls the coupling of an associated bit line 238 to local I/O line 236. Local I/O line 236 also couples to a write driver 250 that drives the coupled bit lines during a block write operation. Each bit line 238 and local I/O line 236 is typically composed of a complementary line pair. For clarity, the complementary lines and their associated N-channel transistors are not shown in FIG. 2.

As shown in FIG. 2, local I/O line 236 couples to a group of bit lines 238 (i.e., through transistors 234). The number of bit lines 238 in the group corresponds to the maximum size of the block write. For example, if eight bit lines 238 are coupled to local I/O line 236, a block write to (up to) eight bit lines is supported, as determined by CSLs 232.

The memory array architecture shown in FIG. 2 supports block write operation but has several disadvantages. First, write driver 250 is designed to concurrently drive multiple bit lines, and is typically larger in size and consumes more power than a write driver designed to drive a single bit line. Second, since only one write driver 250 is provided, the same data bit is written to all coupled bit lines during a block write operation. This limitation can undermine the high data transfer rate of the block write operation if, for example, multiple block writes are needed to write multiple data bits. Third, since a variable number of bit lines can be coupled to the write driver, the charge time varies depending on the number of coupled bit lines. The frequency of the clock signal (which affects the data transfer rate) is typically selected based on the slowest charge time corresponding to a worse case situation.

Figure 3:
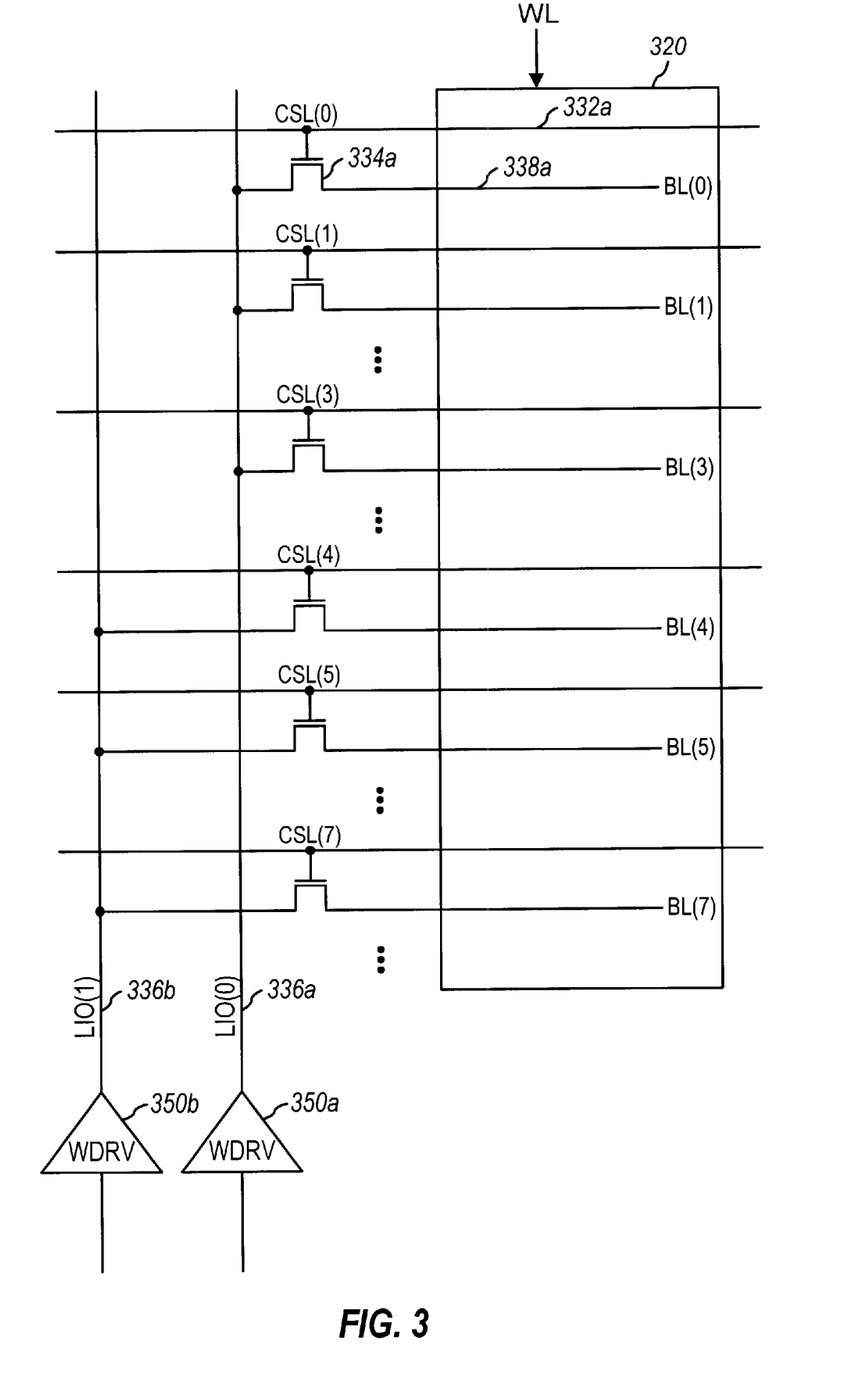
FIG. 3 shows a schematic diagram of another conventional memory array architecture that supports block write operation.

FIG. 3 shows a schematic diagram of another conventional memory array architecture that supports block write operation. The architecture shown in FIG. 3 alleviates some of the problems associated with the architecture shown in FIG. 2 by using multiple (e.g., two) write drivers. Each write driver drives a smaller number of bit lines and can be designed with reduced drive capability.

As shown in FIG. 3, a number of CSLs 332 traverses through a memory array 320. Each CSL 332 couples to the gate of an N-channel transistor 334. The source of transistor 334 couples to a local I/O line (LIO) 336 and the drain of transistor 334 couples to a bit line (BL) 338. Each CSL 332 controls the coupling of an associated bit line 338 to one local I/O line 336. Each local I/O line 336 further couples to an associated write driver 350 that drives the coupled bit lines during a block write operation. Bit lines 338 and local I/O lines 336 are each composed of a complementary line pair, but the complementary lines and their associated N-channel transistors are not shown in FIG. 3 for clarity.

As shown in FIG. 3, local I/O line 336a couples to one group of bit lines 338 (e.g., BL(0) through BL(3)) and local I/O line 336b couples to another group of bit lines 338 (e.g., BL(4) through BL(7)). The number of bit lines in each group determines the maximum size of the block write for that group. For example, if four bit lines 338 are coupled to local I/O line 336a and four bit lines 338 are coupled to local I/O line 336b, a block write to up to four bit lines is supported by each local I/O line 336.

The architecture shown in FIG. 3 provides some improvements over the architecture shown in FIG. 2, but still has several disadvantages. First, each write driver 350 is still designed to concurrently drive multiple bit lines, and is typically larger in size and consumes more power than a write driver designed to drive a single bit line. Second, each local I/O line 336 allows one data bit to be written to the coupled bit lines during a block write operation. Thus, the architecture shown in FIG. 3 supports a block write of up to two data bits to the memory array, which generally provides a higher data transfer rate than the architecture shown in FIG. 2 but is can still under-utilize the block write operation. Third, since a variable number of bit lines can be coupled to each write driver, the charge time varies depending on the number of coupled bit lines. And fourth, the additional local I/O line(s) and write driver(s) result in larger die area and increased cost.

Figure 4:
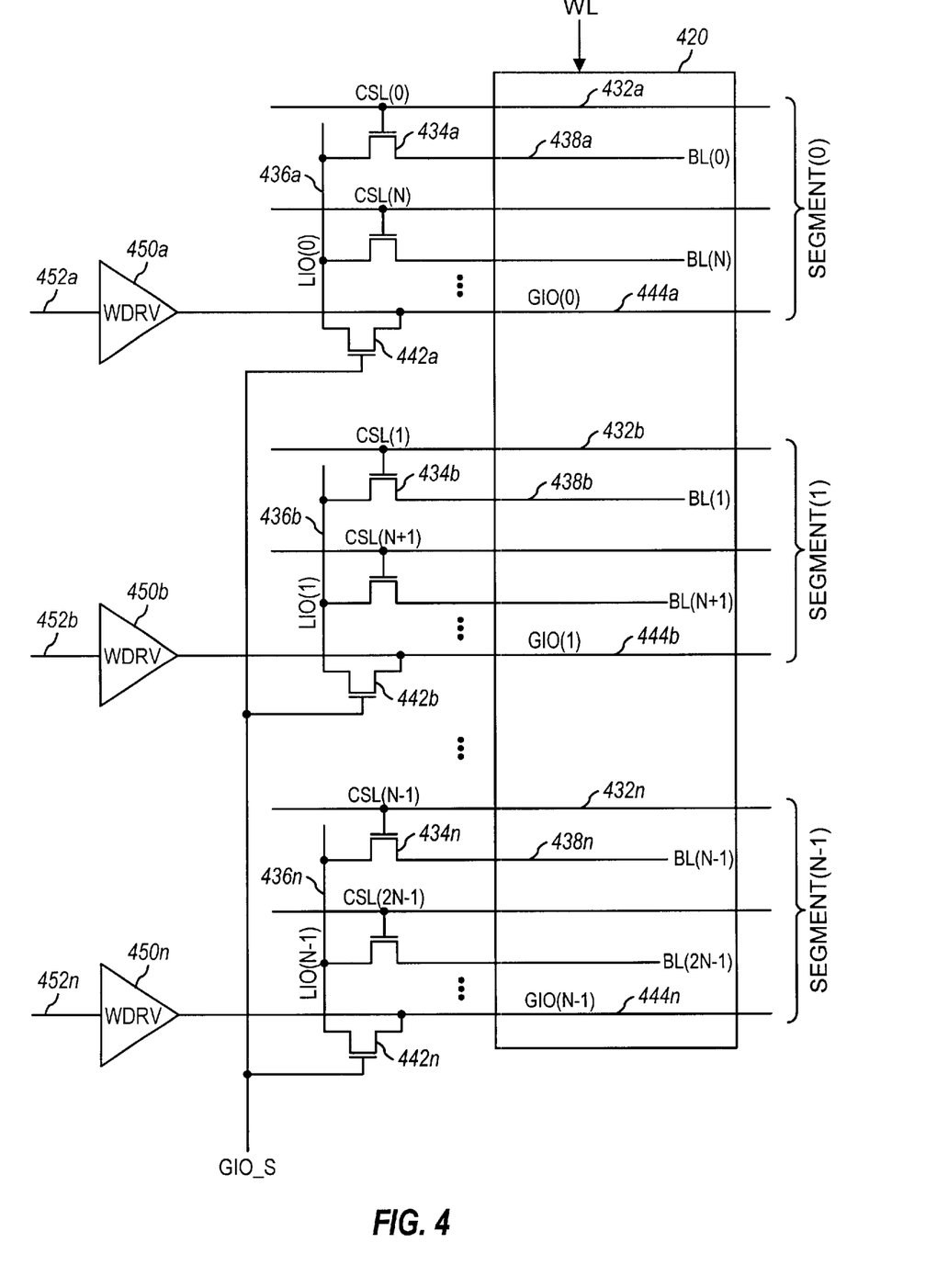
FIG. 4 shows a schematic diagram of a segmented memory array architecture of the invention that supports block write operation.

FIG. 4 shows a schematic diagram of a segmented memory array architecture of the invention that supports block write operation and has many advantages over the conventional memory array architectures shown in FIGS. 2 and 3. As shown in FIG. 4, a memory array 420 is partitioned into a number of segments. Within each segment, a number of CSLs 432 traverses through memory array 420. Each CSL 432 couples to the gate of an N-channel transistor 434. The source of transistor 434 couples to a local I/O line (LIO) 436 and the drain of transistor 434 couples to a bit line (BL) 438. As with FIGS. 2 and 3, the complementary lines and N-channel transistors are not shown in FIG. 4 for clarity.

Local I/O line 436a couples to bit lines 438 (through transistors 434) in segment (0), local I/O line 436b couples to bit lines 438 in segment (1), and so on. However, unlike the local I/O lines in FIGS. 2 and 3 that traverse the entire length of the memory array, each local I/O line 436 traverses only a portion of (e.g., approximately 1/N) the length of memory array 420. Although not apparent from FIG. 4, each segment includes M bit lines, thus providing a memory array having MxN bit locations for each word line.

Each local I/O line 436 further couples to the source of an N-channel transistor 442. The gate of transistor 442 couples to a global I/O control signal (GIO_S) and the drain of transistor 442 couples to a global I/O line (GIO) 444. Transistor 442 behaves as a pass transistor that couples local I/O line 436 to its associated global I/O line 444. Each global I/O line 444 is also typically composed of a complementary line pair, but the complementary lines are not shown for clarity.

Each global I/O lines 444 further couples to a respective write driver 450 that drives the bit line(s) coupled to local I/O line 436 associated with that write driver. The input of write driver 450 couples to an internal data line 452. Write driver 450 can be designed to drive one or more bit lines in a segment, with the typical number being one. Alternatively, write driver 450 can be designed to drive multiple segments from two or more memory arrays, or all memory arrays within a memory array block. Generally, one write driver 450 is provided for each global I/O line 444, which can couple to one or more local I/O lines 436. Each global I/O line 444 can concurrently couple to zero or more bit lines at any given moment. The design of write driver 450 is known in the art and not described in detail herein.

In one aspect of the invention, the columns (i.e., the bit lines) of memory array 420 are designated to respective segments in a manner such that two columns within the same segment are not concurrently written to. As shown in FIG. 4, segment (0) includes bit lines that are spaced N bits apart, starting with BL(0), segment (1) includes bit lines that are spaced N bits apart, starting with BL(1), and so on. This configuration allows for a concurrent write of (up to) N data bits into a number of memory locations (e.g., BL(n) through BL(n+N−1)) through N local I/O lines 436. However, the bit lines can be arranged in other ways, and these various arrangements are within the scope of the invention.

The architecture shown in FIG. 4 allows for a block write of N data bits to memory array 420. These N data bits are provided through N local I/O lines 436. However, the combined length of N local I/O lines 436 is approximately equal to that of a single local I/O line of the conventional memory array architectures shown in FIGS. 2 and 3. For example, local I/O lines 436 can be designed to be approximately equal in length and each local I/O line 436 can be approximately 1/N the length of a conventional local I/O line (i.e., local I/O line 236 in FIG. 2). Implementation of local I/O lines 436 thus requires a small additional die area (if any) more than that of a conventional memory array architecture. Thus, the architecture shown in FIG. 4 supports block write operation with minimal "penalty" in die area.

Another aspect of the invention is the arrangement of local I/O lines 436 and global I/O lines 444. As shown in FIG. 4, local I/O lines 436 are arranged in substantially the same orientation as local I/O lines 336 in FIG. 3. Global I/O lines 444 can be efficiently implemented similar to CSLs 432. The control signal (GIO_S) can also be efficiently implemented with minimal additional die area.

The architecture shown in FIG. 4 is well suited for a double data rate (DDR) operation which allows for two data bits to be written (per local I/O line 436) in a single clock cycle using both edges of the clock signal. DDR improves the data transfer rate but imposes additional requirements for the block write operation. As an example, a memory array architecture that normally supports a signal data rate (SDR) block write of eight data bits would need to support a DDR block write of 16 data bits. The operation of a segmented memory array architecture for DDR block write is further described below.

The segmented memory array architecture in FIG. 4 provides many advantages over the architectures shown in FIGS. 2 and 3. Some of these advantages are described below.

First, since N write drivers are provided, one for each segment, a block write of N data bits to N bit lines can be achieved with essentially no penalty in performance (i.e., no degradation in the charge time). The block write performance for the segmented memory array architecture is thus approximately similar whether one or many data bits are written to the memory array. With the invention, a block write of up to N data bits can be achieved by simply enabling as many write drivers as needed. Each write driver drives a similar load (e.g., one bit line) regardless of the size of the block write. In contrast, the block write performances of the architectures of FIGS. 2 and 3 vary depending on the size of the block write, which in turn determines the load of the write driver.

Second, since each write driver typically drives only one bit line at any given moment, the write drivers can be designed having similar drive capability and power consumption as a conventional write driver. In fact, since the local I/O line in the segmented memory array architecture is shorter in length, the parasitic effects can actually be reduced. In contrast, the write drivers of the architectures of FIGS. 2 and 3 are designed to drive multiple bit lines, and the additional drive capability can result in higher power consumption, more switching noise, and other deleterious effects.

Third, the segmented memory array architecture provides block write capability with a small die penalty. As shown in FIG. 4, the length of each local I/O line is a fraction of that of a conventional memory array architecture. In fact, the combined length of the local I/O lines in FIG. 4 is approximately equal to that of a single local I/O line in FIGS. 2 and 3. As stated above, the global I/O lines can be efficiently implemented (i.e., in similar manner as a bit line or CSL). The additional area needed to implement the additional write drivers can be small, particularly since each write driver can be dimensioned to be similar in size to a conventional write driver.

Fourth, the use of N write drivers allows for a block write of N data bits into the memory array. This design enhances the efficiency of the block write operation and can greatly increase the data transfer rate. This design can also improve the overall performance of a system because a block of N data bits can be performed in less time than the architectures shown in FIGS. 2 and 3.

Additional advantages can also be realized depending on the applications in which the segmented memory array architecture is used. For example, the invention can provide other benefits when operated in DDR operation, as described in further detail below.

Figure 5:
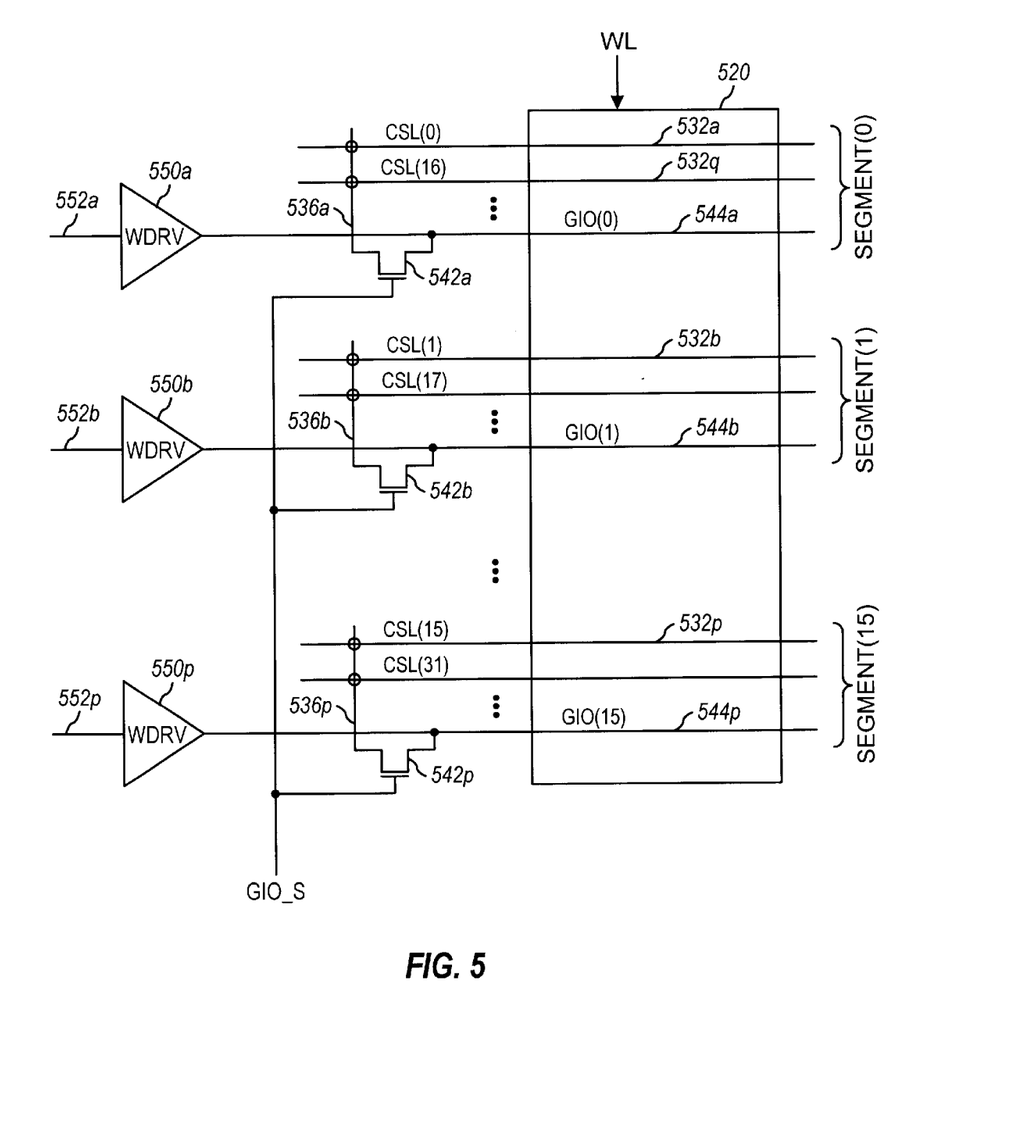
FIG. 5 shows a schematic diagram of a specific segmented memory array architecture that supports 16-bit block write operation.

FIG. 5 shows a schematic diagram of a specific segmented memory array architecture that supports 16-bit block write operation. As shown in FIG. 5, a memory array 520 is partitioned into 16 segments. Within each segment, a number of CSLs 532 traverses through memory array 520. Each CSL 532 controls a transistor that couples a bit line to a local I/O line (LIO) 536, as represented by the circle on local I/O line 536. Each local I/O line 536 couples to zero or more bit lines within a particular segment, depending on the logic states of CSLs 532 within that segment. Each local I/O line 536 further couples to an associated global I/O line 544 through a N-channel transistor 542. Each local I/O line 536 traverses approximately a sixteenth of the length of memory array 520. The bit lines and their pass transistors are not shown in FIG. 5 for clarity.

Each global I/O lines 544 further couples to a respective write driver 550 that drives the bit line(s) coupled to the associated local I/O line 536. The input of write driver 550 couples to an internal data line 552. Write driver 550 can be designed to drive one or more bit lines in a segment, with the typical number being one.

As shown in FIG. 5, the columns (i.e., the bit lines) of memory array 520 are designated to respective segments in a manner such that up to 16 columns can be concurrently written to. For example, segment (0) includes bit lines that are spaced 16 bits apart, starting with BL(0), segment (1) includes bit lines that are spaced 16 bits apart, starting with BL(1), and so on. This configuration allows for a block write of (up to) 16 data bits into 16 memory locations through 16 local I/O lines 536. For example, in one block write operation, bit lines corresponding to CSL(0) through CSL(15), or CSL(10) through CSL(25), or other combinations of CSLs, can be written to.

Figure 6:
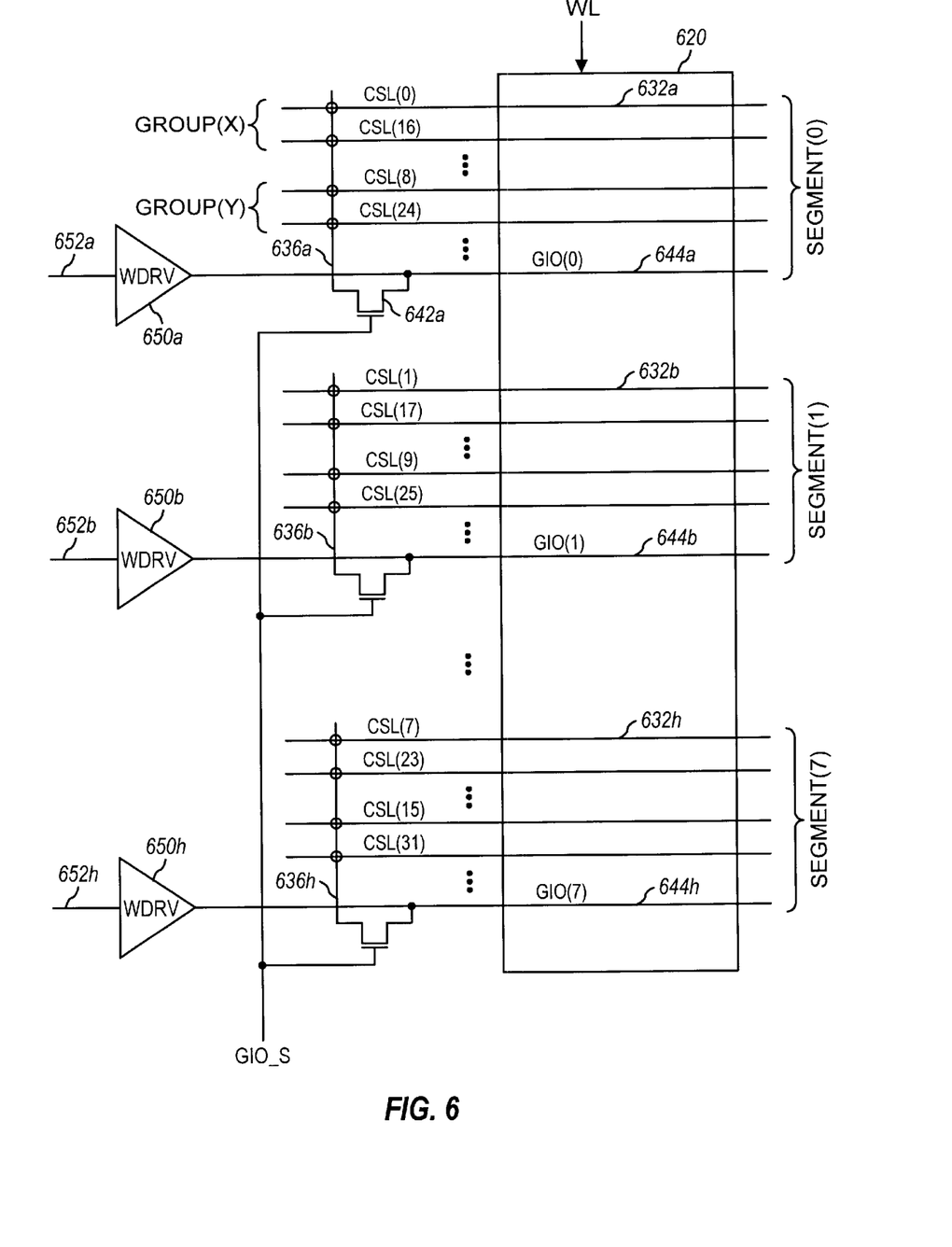
FIG. 6 shows a schematic diagram of a specific segmented memory array architecture that supports 8-bit block write operation and 16-bit double data rate (DDR) block write operation.

FIG. 6 shows a schematic diagram of a specific segmented memory array architecture that supports 8-bit block write operation. As shown in FIG. 6, a memory array 620 is partitioned into eight segments. Within each segment, a number of CSLs 632 traverses through memory array 620. Each CSL 632 controls a transistor that couples a bit line to a local I/O line (LIO) 636, as represented by the circle on local I/O line 636. Each local I/O line 636 couples to zero or more bit lines within a particular segment, depending on the logic states of CSLs 632 within that segment. Each local I/O line 636 further couples to a corresponding global I/O line 644 through a N-channel transistor 642. Each local I/O line 636 traverses approximately one eight of the length of memory array 620. As in FIG. 5, the bit lines and their pass transistors are not shown in FIG. 6 for clarity.

Each global I/O lines 644 further couples to a respective write driver 650 that drives the bit line(s) coupled to the associated local I/O line 636. The input of write driver 650 couples to an internal data line 652. Write driver 650 can be designed to drive one or more bit lines in each segment; however, the typical number is one.

As shown in FIG. 6, the columns (i.e., the bit lines) of memory array 620 are designated to respective segments in a manner such that up to eight different columns can be concurrently written to. For example, segment (0) includes bit lines that are spaced eight bits apart, starting with BL(0), segment (1) includes bit lines that are spaced eight bits apart, starting with BL(1), and so on. This configuration allows for a block write of (up to) eight data bits into eight memory locations through eight local I/O lines 636.

The segmented memory array architectures in FIGS. 4 through 6 can be configured or operated such that each write driver drives one bit line at any given moment. This configuration results in similar performances for a block write or a "normal" write of a single data bit. Alternatively, each write driver can be designed and operated to concurrently drive multiple bit lines to achieve a block write to a larger number of bit lines than the number of available write drivers.

In one aspect of the invention, each segment of a memory array can further be partitioned into two (or more) groups. For example, referring to FIG. 6, group (X) can include bit lines that are spaced 16 bits apart, starting with the lowest numbered bit line in the segment (e.g., BL(0)), and group (Y) can include bit lines that are also spaced 16 bits apart, starting with next lowest numbered bit line (e.g., BL(8)). Using this arrangement, a block write of 16 data bits can be achieved using eight write drivers, with each write driver driving one bit line from group (X) and one bit line from group (Y). Accordingly, each write driver can be designed with greater drive capability to reduce performance degradation from driving multiple bit lines. The architecture shown in FIG. 6 can thus provide 16-bit block write capability, or twice the number of segments/write drivers. The 16-bit block write operation using the architecture shown in FIG. 6 can (possibly) be achieved using less power than that of FIG. 5 because only half the number of write drivers are employed.

The block write operation can be further extended such that a block write to (up to) P×N bit lines can be performed by N write drivers, where each write driver drives (up to) P bit lines. Again, the sacrifice in performance from driving multiple bit lines can be reduced by properly designing the write drivers.

For block write operation, the data bits are typically provided to, and available from, the internal data registers before they are needed. The masking information that determines which CSLs to enable is typically provided at the device input/output pads (or DQ pads). Normally, one DQ pad provides masking information for one bit line. A data strobe signal (DQS) indicates the availability of the masking information on the DQ pads and is used to initiate the block write operation.

For DDR operation, a block write of data bits to 2 M bit lines is performed in two "half-block" write operations. The first half-block write operation writes to the first group of M bit lines on one clock edge (e.g., the rising edge), and the second half-block write operation writes to the second group of M bit lines on the alternate clock edge (e.g., falling edge). The masking information is also provided on the DQ pads in two groups. For example, for a 16-bit DDR block write operation, eight DQ pads provides masking information for eight bit lines on one clock edge and masking information for another eight bit lines on the alternate clock edge. Since the masking information is provided on both clock edges in DDR operation and since the data bits are already available from the internal data registers, the first half-block write operation can be initiated upon receiving the masking information for the first group of bit lines.

Figure 7:
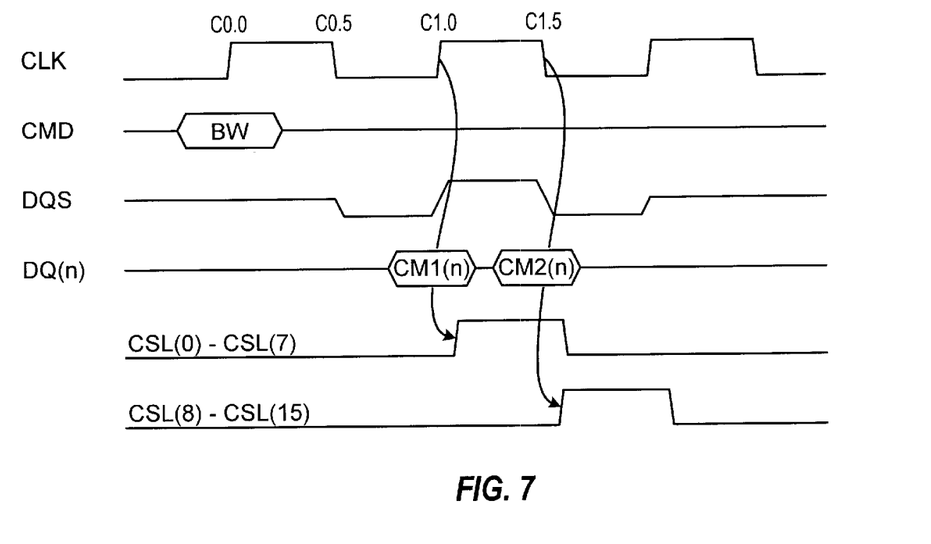
FIG. 7 shows a timing diagram of the clock and control signals for a DDR block write operation.

FIG. 7 shows a timing diagram of the clock and control signals for a DDR block write operation. The clock signal (CLK) is shown at the top of FIG. 7. A block write command (BW) is received in on a command signal (CMD) at the C0.0 clock edge. Subsequent to each block write command, the data strobe signal (DQS) is activated for two clock edges (e.g., C1.0 and C1.5). Each full edge of the DQS signal corresponds to a set of masking bits on the DQ pads. For example, on the DQ(n) pad, the masking bit CM1(n) is received at the first full rising edge of the DQS signal and the masking bit CM2(n) is received at the first full falling edge of the DQS signal. The masking bits CM1 control (or enable) the CSLs for the first group of bit lines and the masking bits CM2 control the CSLs for the second group of bit lines.

In one embodiment, the column select lines for both groups (e.g., CSL(0) through CSL(15)) are activated after all masking information are received (i.e., based on the C1.5 clock edge). In another embodiment, the column select lines for each group of bit lines can be activated upon receiving masking information for that particular group. For example, the column select lines for the first group (e.g., CSL(0) through CSL(7)) can be activated based on the C1.0 clock edge and the column select lines for the second group (e.g., CSL(8) through CSL(15)) can be activated based on the C1.5 clock edge.

Figure 8:
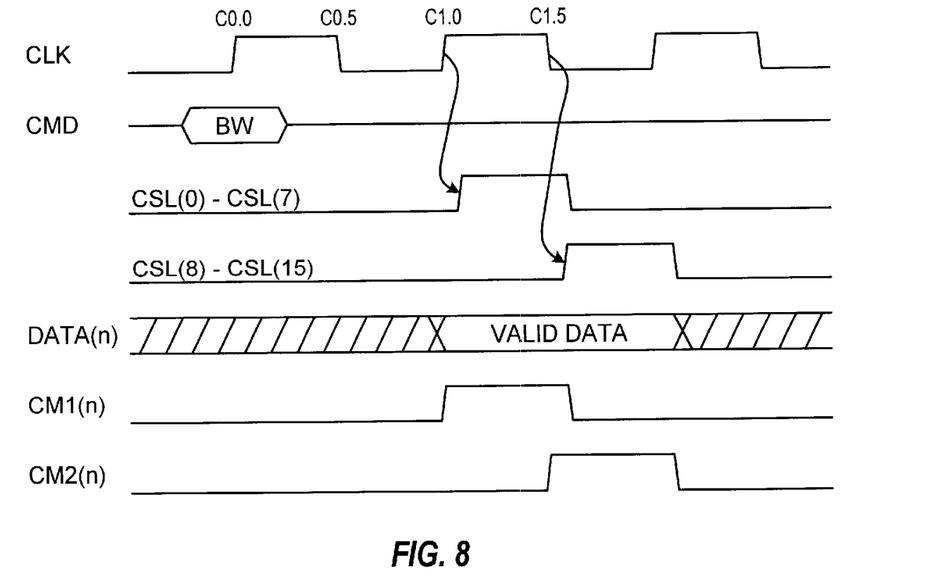
FIG. 8 shows a timing diagram of internal signals for the DDR block write operation.

FIG. 8 shows a timing diagram of internal signals for a DDR block write operation. The clock signal (CLK), command signal (CMD), and column select lines are redrawn at the top of FIG. 8. The data bits (e.g., represented by DATA(n)) are available and valid during the time the CSLs are active. The masking signals (represented by CM1(n) for the first group and CM2(n) for the second group) are generated based on the masking information received on the DQ pads. One masking signal CM1(n) is generated for each bit line in the first group and one masking signal CM2(n) is generated for each bit line in the second group. For each group, the masking signals are active when the CSLs for that group are active. For example, the masking signal CM1(n) is active when CSL(0) through CSL(7) are active, and the masking signal CM2(n) is active when CSL(8) through CSL(15) are active.

Although some embodiments of the invention described above are specifically directed toward double data rate operation, the general inventive concept can be extended to concurrent memory access of any number of data bits. For example, the architectures shown above can easily be modified for a quadruple data rate operation, an octal data rate operation, or a Q data rate operation (where Q is any integer greater than one).

The memory arrays described herein can be implemented within a stand-alone integrated circuit (IC) such as, for example, a dynamic random access memory (DRAM) IC, a synchronous graphics RAM (SGRAM), and other memory devices. The memory arrays can also be implemented within other ICs, such as a processor, a controller, a digital signal processor, an application specific integrated circuit (ASIC), and others. The memory architectures described herein can be implemented on a memory array that is embedded within an integrated circuit such as, for example, central processing unit (CPU).

The previous description of the specific embodiments is provided to enable any person skilled in the art to make or use the invention. The various modifications to these embodiments will be readily apparent to those skilled in the art, and the generic principles defined herein may be applied to other embodiments without the use of the inventive faculty. Thus, the invention is not intended to be limited to the embodiments shown herein but is to be accorded the widest scope consistent with the principles and novel features disclosed herein, and as defined by the following claims.

What is claimed is:

1. A memory device comprising:
   at least one memory array, wherein each memory array is partitioned into N segments and each segment includes at least one bit line;
   N local I/O lines for each memory array, wherein one local I/O line is associated with each segment of the memory array, wherein each local I/O line operatively couples to zero or more of the at least one bit line based on at least one column select line, wherein each of the N local I/O lines associated with a particular memory array has a length that is a portion of a length of the memory array, and wherein the N local I/O lines associated with each memory array are arranged in a straight line and are positioned transverse to the at least one bit line in the memory array; and
   at least N write drivers, wherein each local I/O line is further associated with one write driver, and wherein each write driver the zero or more bit lines operatively coupled to the associated local I/O line, and
   wherein the memory device is operated in a double data rate (DDR) operation, wherein a block write operation is performed by writing to a first group of M bit lines during a first clock phase and to a second group of M bit lines during a second clock phase, and wherein the writing to the first group of M bit lines is initiated upon receiving masking information for the first group.

2. The device of claim 1 wherein a block write operation is performed by concurrently driving M write drivers to write to a group of M bit lines, where M is less than or equal to N.

3. The device of claim 2 wherein the group of M bit lines includes bit lines from M segments.

4. The device of claim 2 wherein the M bit lines in the group have consecutively numbered addresses.

5. The device of claim 1 wherein a block write operation is performed by concurrently driving N write drivers, and wherein each write driver concurrently writes to a group of P bit lines in a segment associated with the write driver, where P is zero or more.

6. The device of claim 1 wherein each memory array includes at least sixteen segments.

7. The device of claim 1 wherein each memory array includes at least eight segments.

8. The device of claim 1 wherein a combined length of the N local I/O lines associated with each memory array is approximately equal to a length of the memory array.

9. The device of claim 1 wherein each segment includes a plurality of bit lines, and wherein the bit lines included in each segment are associated with addresses that are numbered N bits apart.

10. The device of claim 9 wherein each segment is partitioned into two groups, and wherein the bit lines included in each group are associated with addresses that are numbered 2N bits apart.

11. The device of claim 1 further comprising:
   at least N global I/O lines, one global I/O line coupled to each write driver, wherein each local I/O line is further associated with one global I/O line.

12. The device of claim 11 further comprising:
   N pass transistors for each memory array, each pass transistor coupling a respective local I/O line to the associated global I/O line.

13. The device of claim 12 wherein the N pass transistors for each memory array are configured to receive a common control signal.

14. The device of claim 11, wherein the at least N global I/O lines are positioned parallel to bit lines in the memory array.

15. The memory device of claim 1 wherein the memory device includes at least 256 million bits (Mbits) of memory.

16. A dynamic random access memory (DRAM) device comprising the memory array and local I/O lines of claim 1.

17. A synchronous graphics random access memory (SGRAM) device comprising the memory array and local I/O lines of claim 1.

18. An embedded memory integrated circuit comprising the memory array and local I/O lines of claim 1.

19. The device of claim 1, wherein each write driver is dimensioned and operated to drive a single bit line at any particular moment.

20. A memory device comprising:
   a plurality of memory blocks, each memory block including a plurality of memory arrays, each memory array partitioned into N substantially similar segments, wherein each segment includes a plurality of bit and is associated with a local I/O line and a write driver that operatively couples to the local I/O line, wherein each of N local I/O lines associated with each memory array has a length that is a portion of a length of the memory array, and
   wherein the memory device supports double data rate (DDR) operation, wherein a block write operation is performed by concurrently driving M write drivers to write to a group of M bit lines, where M is less than or equal to N, and wherein the writing to the first group of M bit lines is initiated upon receiving masking information for the first group.

21. A integrated circuit comprising:
   a memory array partitioned into a plurality of segments, each segment including
   at least one bit line, and
   a local I/O line operatively coupled to zero or more of the at least one bit line based on at least one column select line associated with the at least one bit line, wherein the local I/O line has a length that is a portion of a length of the memory array; and
   a plurality of write drivers, each write driver operatively coupled to an associated local I/O line, wherein each write driver concurrently drives the zero or more bit lines operatively coupled to the local I/O line associated with that write driver, and
   wherein the memory array is operated in a double data rate (DDR) operation, wherein a block write operation is performed by writing to a first group of M bit lines during a first clock phase and to a second group of M bit lines during a second clock phase, where M is two or more, and wherein the writing to the first group of M bit lines is initiated upon receiving masking information for the first group.

* * * * *